(12) United States Patent
Pallini, Jr. et al.

(10) Patent No.: US 8,684,419 B2
(45) Date of Patent: Apr. 1, 2014

(54) TUBULAR CONNECTOR HAVING A SECONDARY SHOULDER

(75) Inventors: Joseph William Pallini, Jr., Tomball, TX (US); Kevin Edward O'Dell, Katy, TX (US)

(73) Assignee: Vetco Gray Inc., Houston, TX (US)

( * ) Notice: Subject to any disclaimer, the term of this patent is extended or adjusted under 35 U.S.C. 154(b) by 0 days.

(21) Appl. No.: 13/593,765

(22) Filed: Aug. 24, 2012

(65) Prior Publication Data

US 2014/0054887 A1 Feb. 27, 2014

(51) Int. Cl.
*F16L 25/00* (2006.01)
(52) U.S. Cl.
USPC .......................................... 285/332.2; 285/355
(58) Field of Classification Search
USPC .................. 285/332, 333, 390, 355, 332.2
See application file for complete search history.

(56) References Cited

U.S. PATENT DOCUMENTS

| | | |
|---|---|---|
| 5,388,866 A | 2/1995 | Schlosser |
| 5,450,904 A | 9/1995 | Galle |
| 5,997,045 A | 12/1999 | Boe et al. |
| 6,070,913 A | 6/2000 | Hopper et al. |
| 6,578,881 B2 | 6/2003 | Lynn et al. |
| 6,752,436 B1 | 6/2004 | Verdillon |
| 6,817,633 B2 | 11/2004 | Brill et al. |
| 7,237,810 B2 | 7/2007 | Hollingsworth et al. |
| 7,549,682 B2 | 6/2009 | Pallini, Jr. et al. |
| 2011/0101684 A1* | 5/2011 | Leng .......................... 285/332.2 |

* cited by examiner

*Primary Examiner* — Aaron Dunwoody
(74) *Attorney, Agent, or Firm* — Bracewell & Giuliani LLP

(57) ABSTRACT

A tubular connector secures two coaxial tubulars using a box and pin connection. A pin end tubular member having an axis and a pin end inserts into a box end tubular member having a box end. A pin end flange formed on an outer diameter of the pin end tubular member receives an end of the box end of the box end tubular member. An inwardly depending flange is disposed on the inner diameter of the box end portion. The inwardly depending flange is spaced apart from the box end planar surface and has a box end shoulder formed at an angle to the axis facing a same direction as the box end planar surface of the box end tubular member. An end of the pin end of the pin end tubular member engages with the inwardly depending flange for compressive load transfer.

21 Claims, 3 Drawing Sheets

TUBULAR CONNECTOR HAVING A SECONDARY SHOULDER

BACKGROUND OF THE INVENTION

1. Field of the Invention

This invention relates in general to drilling and production of oil and gas wells and, in particular, to a tubular connector having a secondary load transfer shoulder.

2. Brief Description of Related Art

Offshore hydrocarbon wells often contain one or more casing strings of large diameter pipe, such as 16 inches or greater in diameter. Production risers extending from subsea well equipment to the surface are also made up of fairly large diameter pipes. The joints of pipe, whether in a casing string or production riser string, are connected together by threaded connections. A typical threaded connection has internal threads on a conical portion of a box that engage external threads on a pin. Normally, the pin has an external shoulder at the base of the threads that is engaged by the rim of the box when made up. A compressive load on the string of casing acts against the external shoulder. Typically, the compressive load capacity of the connector is less than the compressive load capacity of the pipe.

Connectors having both external and internal load shoulders are known in the prior art. The nose of the pin engages the internal load shoulder and the rim of the box engages the external load shoulder. However, tolerance stack ups and high stiffness make it difficult to achieve proper engagement of both the internal and external shoulders. Under compressive loading, the outer diameter shoulder also creates an internal bending moment that is offset from the compressive load path transmitting through the pipe to the connector and back into the pipe. The bending moment contributes to the connectors having a compressive load strength that is less than the compressive load strength of the tubular members individually. Internal shoulders alone create very eccentric paths for tension loads and very high stresses under combined compression and internal pressure. As a result, the connectors are often formed of stronger materials or have larger diameters to accommodate the additional compressive load. This can make it difficult to manufacture the tubulars, add to their weight, and make manipulating the tubulars more difficult. In addition, where the joined tubulars are run concentrically through another set of tubulars, the outer tubulars must be increased in size to accommodate the larger diameter of the joints.

Attempts have been made to place dual load transfer shoulders on both the internal and external diameters of the connectors to increase the load transfer area and counteract the bending moment. However, this resulted in little control of where the load transfers due to tolerance stack up issues and high stiffness of the internal shoulder.

SUMMARY OF THE INVENTION

These and other problems are generally solved or circumvented, and technical advantages are generally achieved, by preferred embodiments of the present invention that provide a tubular connector having a secondary load transfer shoulder. In accordance with an embodiment of the present invention, a tubular connector has a pin having a nose, an external shoulder, and a conical portion between the external shoulder and the nose containing a set of external threads. A box has a bore, a rim that engages the external shoulder and a set of internal threads in the bore that engage the external threads. An internal shoulder in the bore is engaged by an end of the nose when the rim of the box engages the external shoulder. An annular recess is formed in the bore of the box on a side of the internal shoulder opposite the nose. The annular recess is sized to provide flexibility to the internal shoulder so as to allow the internal shoulder to deflect when engaged by the end of the nose.

When the pin end of the pin end tubular member is inserted into the box end of the box end tubular member, the pin end of the pin end tubular member and the box end of the box end tubular member secure the pin end tubular member to the box end tubular member. The pin end shoulder of the pin end flange is adjacent to the planar surface of the end of the box end of the box end tubular member, and the box end shoulder of the inwardly depending flange is adjacent to the planar surface of the end of the pin end portion of the pin end tubular member. Compressive load transfer occurs through at least one of the planar surface of the end of the box end portion and the pin end shoulder and the planar surface of the end of the pin end portion and the box end shoulder. When an increased compressive load is applied to the pin end tubular member and the box end tubular member, a portion of the compressive load transfers across the box end shoulder of the inwardly depending flange of the box end portion of the box end tubular member and the end of the pin end portion of the pin end tubular member.

An advantage of a preferred embodiment is that it provides a tubular connector that has an increased compressive load capacity over prior art tubular connectors. In some disclosed embodiments, the compressive strength of the tubular connector is equal to the compressive strength of the pipe joined by the tubular connector. Still further, the disclosed embodiments provide an internal shoulder that is not subject to the tolerance stack up and high stiffness complications of prior art internal shoulders. The internal shoulder is a designed spring that deflects and gets stiffer as load is applied. As the load increases, it does not all go to the outer shoulder, and since the internal shoulder is in line with the pipe, the load path is straight. The straight load path results in less moment generated as with a traditional external shoulder. The disclosed embodiments also provide a tubular connector that has a greater bending capacity than prior art tubular connectors. Still further, the disclosed embodiments do not interfere with the flow profile through the central passage of the joined tubulars. The disclosed embodiments also provide a joint connector for tubular members that does not require a substantial increase in diameter of the joint to have increased capabilities.

BRIEF DESCRIPTION OF THE DRAWINGS

So that the manner in which the features, advantages and objects of the invention, as well as others which will become apparent, are attained, and can be understood in more detail, more particular description of the invention briefly summarized above may be had by reference to the embodiments thereof which are illustrated in the appended drawings that form a part of this specification. It is to be noted, however, that the drawings illustrate only a preferred embodiment of the invention and are therefore not to be considered limiting of its scope as the invention may admit to other equally effective embodiments.

DETAILED DESCRIPTION OF THE PREFERRED EMBODIMENT

The present invention will now be described more fully hereinafter with reference to the accompanying drawings which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout.

In the following discussion, numerous specific details are set forth to provide a thorough understanding of the present invention. However, it will be obvious to those skilled in the art that the present invention may be practiced without such specific details. Additionally, for the most part, details concerning rig operation, subsea assembly connections, riser use, and the like have been omitted inasmuch as such details are not considered necessary to obtain a complete understanding of the present invention, and are considered to be within the skills of persons skilled in the relevant art.

Figure 1:
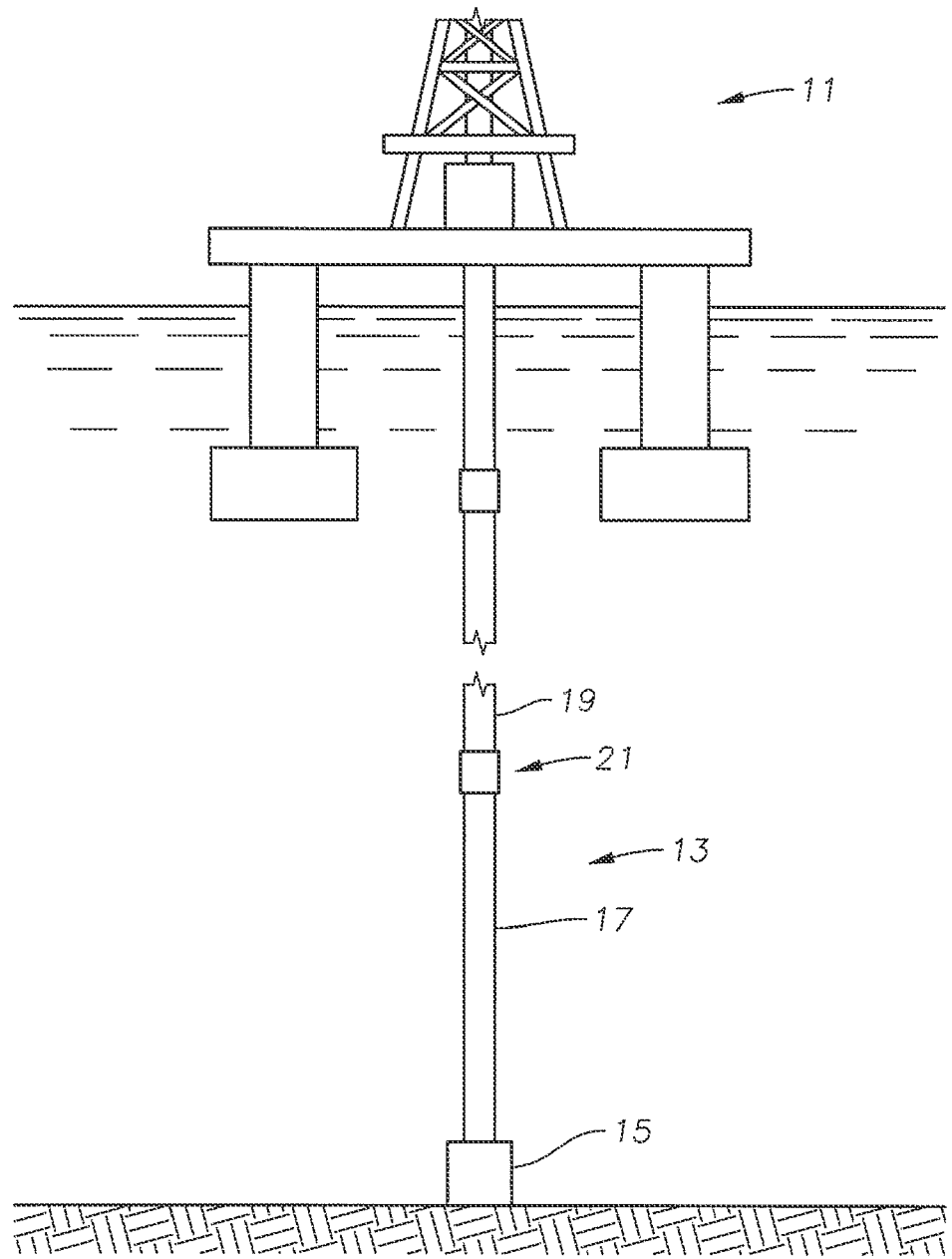
FIG. 1 is a schematic representation of a riser extending between a subsea wellhead assembly and a surface platform in accordance with an embodiment.

Described herein are example embodiments of connecting tubulars to form a string of tubulars. Shown in a side view in FIG. 1 is one example of an offshore platform 11 having a production riser 13 depending subsea for connection with a subsea wellhead assembly 15 shown on the sea floor. Riser 13 may be formed of a plurality of tubulars, for example a lower tubular 17 and an upper tubular 19, extending several thousand feet between platform 11 and subsea wellhead assembly 15. In the embodiment of FIG. 1, riser 13 is assembled by connecting tubulars 17, 19 at a joint 21 in the manner described in more detail below.

Figure 2:
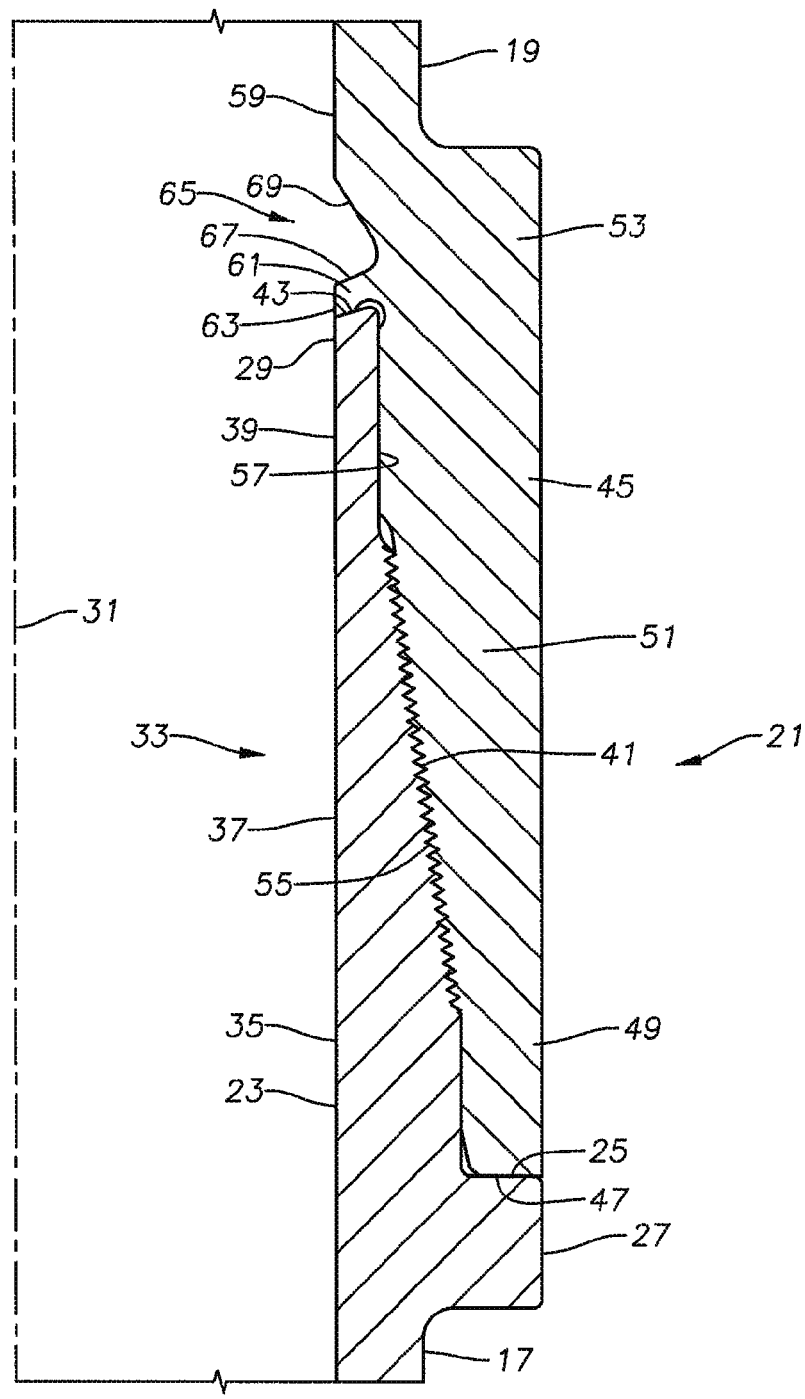
FIG. 2 is a side sectional view of a portion of a joint for connecting two tubulars of the riser of FIG. 1 in accordance with an embodiment.

Referring to FIG. 2, a sectional view of joint 21 in a made-up position is shown. Lower tubular 17 has a pin end 23 having an upward facing shoulder 25 on an outer diameter portion of lower tubular 17. As shown in FIG. 2, pin end 23 includes an outer diameter flange 27 having an outer diameter larger than the diameter of lower tubular 17. Outer flange 27 may be axially spaced from an end 29 of pin end 23 along an axis 31 of lower tubular 17. Upward facing shoulder 25 extends from an outer diameter of pin end 23 radially outward to the outer diameter of flange 27. Pin end 23 includes an upwardly extending pin 33. Pin 33 includes a cylindrical proximal pin end portion 35 proximate to flange 27. Proximal pin end portion 35 may join flange 27 proximate to upward facing shoulder 25. Pin 33 includes a conical medial pin end portion 37 extending toward end 29 from proximal pin end portion 35. In the illustrated embodiment, medial pin end portion 37 tapers from proximal pin end portion 35 to a nose or distal pin end portion 39 of pin 33 at end 29 of pin 33. In the illustrated embodiment, medial pin end portion 37 is wider at proximal pin end portion 35 than at distal pin end portion 39. Threads or grooves 41 may be formed on an outer diameter surface of medial pin end portion 37. Distal pin end portion 39 may be generally cylindrical as shown in FIG. 2 and have an axial length such that end 29 may be spaced apart from medial pin end portion 37. Distal pin end portion 39 also includes an upwardly facing end or shoulder 43 at end 29. In the illustrated embodiment, upwardly facing shoulder 43 may be conical and face slightly toward axis 31. In this example, A person skilled in the art will recognize that in other embodiments upwardly facing shoulder 43 may be cylindrical.

Continuing to refer to FIG. 2, upper tubular 19 includes a box end 45 having an outer diameter substantially equivalent to the outer diameter of flange 27 of pin end 23. Box end 45 depends downwardly from upper tubular 19 and has a lower end that defines a downward facing shoulder 47. A tubular wall at box end 45 has a thickness at downward facing shoulder 27 that is substantially equivalent to the width of upward facing shoulder 25 of flange 27. Box end 45 has a length substantially equivalent to the length of pin 33 and includes a distal box end portion 49, a medial box end portion 51, and a proximal box end portion 53. Proximal box end portion 53 joins upper tubular 19. Proximal box end portion 53 has an inner diameter that is substantially equivalent to the inner diameter of upper tubular 19. Distal box end portion 49 may be located at an end of box end portion 45 opposite proximate box end portion 53. Distal box end portion 49 may be substantially cylindrical and have an outer diameter equivalent to the outer diameter of flange 27 of lower tubular 17 and an inner diameter greater than the inner diameter of upper tubular 19. In the illustrated embodiment, the inner diameter of distal box end portion 49 is substantially equivalent to the outer diameter of proximal pin end portion 35 so that distal box end portion 49 may surround proximal pin end portion 35 of lower tubular 17. Medial box end portion 51 has a general conical inner diameter extending between distal box end portion 49 and proximal box end portion 53. Medial box end portion 51 may have threads 55 formed on an inner diameter surface that mate with threads 41 on the outer diameter surface of pin end medial portion 37. A person skilled in the art will recognize that the angle of the conical surfaces of pin end medial portion 37 and medial box end portion 51 may be the same so that threads 41, 55 may thread together to join upper tubular 19 to lower tubular 17. A person skilled in the art will understand that upper tubular 19 and lower tubular 17 may be joined by any suitable means. For example, upper tubular 19 and lower tubular 17 may be secured by threaded couplers as shown herein, cammed couplers, collet couplers, or the like, provided joint 21 accommodates compressive load transfer as described in more detail below.

Figure 3:
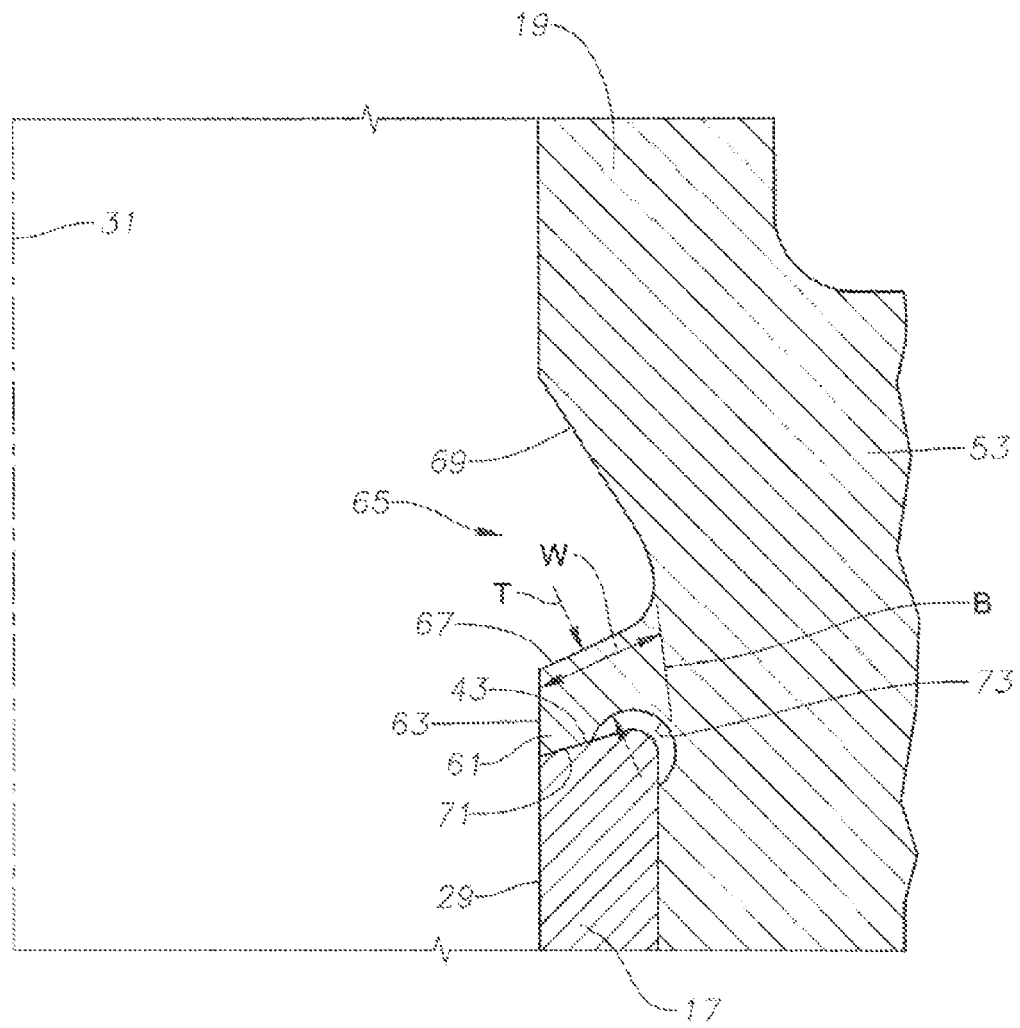
FIG. 3 is a sectional detail view of a secondary shoulder of the joint of FIG. 2 in accordance with an embodiment.

Proximal box end portion 53 may be generally cylindrical and extends form upper tubular 19 to medial box end portion 51. Proximal box end portion has a first diameter 57 at medial box end portion 51, and a second inner diameter 59 at upper tubular 19. Proximal box end portion 53 has an inwardly depending flange 61 positioned intermediate of upper tubular 19 and medial box end portion 51. In an embodiment, inwardly depending flange 61 is spaced apart from the end of distal box end portion 49 so that when pin 33 is inserted into box end 45, upwardly facing shoulder 43 of pin 33 is adjacent to or abuts inwardly depending flange 61. Referring to FIG. 3, inwardly depending flange 61 has a generally cylindrical inner diameter surface 63 that may be substantially equivalent to the inner diameter of upper tubular 19 and the inner diameter of pin end 23. An annular recess 65 is formed on the inner diameter surface of proximal box end portion 53 to define an upwardly facing surface 67 of inwardly depending flange 61 formed at a first angle to axis 31. In the illustrated embodiment, upwardly facing surface 67 is a conical surface. Annular recess 65 is an annular feature having a conical surface 69 formed at a second angle to axis 31 and depending generally toward the outer diameter of box end 45 so that axial surface 69 joins upwardly facing surface 67 spaced outwardly from the inner diameter of upper tubular 19.

Inwardly depending flange 61 includes an internal conical downwardly facing shoulder 71 formed at an angle to axis 31 so that downwardly facing shoulder 71 generally faces outwardly. The angle of downwardly facing shoulder 71 gives more contact pressure to a metal to metal seal that may be placed between upper tubular 19 and lower tubular 17. Where downwardly facing shoulder 71 joins first diameter 57, a generally circular annular groove 73 may be formed. When viewed in the transverse cross section of FIG. 3, groove 73 appears as a partial circle, extending about 250 to about 270 degrees about a centerline of groove 73. Groove 73 may have a diameter sufficient to accommodate a corner of distal pin end portion 39 as described in more detail below. In an exemplary embodiment, inwardly depending flange 61 is flexible based in part on the cut of annular recess 65, the angles of upwardly facing surface 67 and conical surface 69, and the material properties of inwardly depending flange 61. For example, as the angle formed by upwardly facing surface 67 with axis 31 varies from perpendicular to axis 31, the flexibility of inwardly depending flange 61 may increase. Flange 61 has a minimum thickness T that is greater than 40% of the width W of flange 61. Minimum thickness T of flange 61 extends from upwardly facing surface 67 to a lower surface of the internal shoulder measured generally perpendicular to upwardly facing surface 67. Width W is measured from base B of flange 61 to the inner diameter surface 63. Width W is measured along a line that is parallel with the inclination of upwardly facing surface 67 of annular recess 65, Base B of flange 61 extends from the outer most diameter of annular recess 65 to the outermost diameter of groove 73. Because of groove 73, the axial dimension of inner flange 61 is less at its base where it joins the box of box 19 than at inner diameter 63. In the embodiment shown, the axial extent of inner flange 61 at inner diameter 63 is less than the axial extent of annular recess 65 measured at the inner diameter of annular recess 65. In one embodiment, the radial depth of annular recess 65 is the same or greater than the radial thickness of nose 29 of pin 17. The inner diameter 59 of the bore is the same as inner flange inner diameter 63 and immediately above annular recess 65.

When joint 21 is made up, described in more detail below, flange 27 and distal box end portion 49 act as the primary compressive load shoulder. However, as compressive loading is increased, pin end distal portion 29 will push against downwardly facing shoulder 71 of inwardly depending flange 61. As this occurs, and the contact between downwardly facing shoulder 71 and upwardly facing shoulder 43 increases, a portion of the compressive loading of upper tubular 19 and lower tubular 17 is picked up between this interface. In this manner, a portion of any compressive loading will be transferred through inwardly depending flange 61 and pin end distal end portion 29. Due to annular recess 65 and groove 73, inwardly depending flange 61 is flexible, having a decreasing stiffness as compressive loading increases. A person skilled in the art will recognize that the compressive loading between flange 27 and distal box end portion 49 and pin end distal portion 29 and inwardly depending flange 61 may be proportionally allocated based on the sizing of the relative flanges 27, 61, and may vary according the amount of compressive loading and initial amount of contact between upwardly facing shoulder 43 and downwardly facing shoulder 71. Preferably the stiffness to axial deflection of inner flange 63 is much less than the stiffness to axial deflection of pin external flange 27, such as less than 25%. The deflection of inner flange 63 may be elastic or it may be permanent.

In an exemplary non-illustrated embodiment, inwardly depending shoulder 61 is formed such that downwardly facing shoulder 71 is perpendicular to axis 31. In these embodiments, the flexibility of inwardly depending shoulder 61 is increased.

Referring again to FIG. 2, joint 21 may be assembled in the following manner. Box end 45 of upper tubular 19 may be brought proximate to pin end 23 of lower tubular 17. Upper tubular 19 may be manipulated to place box end 45 around pin end 23, bringing threads 41, 55 axially adjacent to each other. In an exemplary embodiment, box end 45 will be brought proximate to and may land on shoulder 25. Threads 51, 55 may be in contact, but not engaged, with one another. Upper tubular 19 may then be rotated relative to lower tubular 17, causing threads 41, 55 to engage and securing upper tubular 19 to lower tubular 17. A person skilled in the art will understand that the relative positions of upper tubular 19 and lower tubular 17 may be reversed so that lower tubular 17 and pin end 23 may be stabbed into upper tubular 19 and box end 45. A person skilled in the art will also understand that different methods to secure upper tubular 19 to lower tubular 17 may be used. Additionally, it is possible that pin nose end 43 may contact internal shoulder 71 before the rim of box end portion 49 lands on external shoulder 25.

In an exemplary embodiment, when distal box end portion 49 lands on flange 27, downward facing shoulder 47 may abut upward facing shoulder 25 and downwardly facing shoulder 71 may land on upwardly facing shoulder 43. In another exemplary embodiment, downwardly facing shoulder 71 may be adjacent to, but not in contact with, upwardly facing shoulder 43. When upper tubular 19 and lower tubular 17 are compressed along axis 31, compressive load transfer between upper tubular 19 and lower tubular 17 occurs primarily through box end 45 and flange 27 through downward facing shoulder 47 and upward facing shoulder 25. However, a portion of the compressive loading may transfer through downwardly facing shoulder 71 and upwardly facing shoulder 43. The proportion of this load transfer will increase as the compressive loading of upper tubular 19 and lower tubular 17 increases. In this manner, inwardly depending flange 61 acts as a secondary load shoulder for joint 21.

A person skilled in the art will understand that while the tubular members are referred to as a lower tubular member and an upper tubular member, it is not necessary that the members be assembled or positioned relative to one another as shown. For example, a first tubular member 17 having upwardly facing shoulder 43 may be axially above a second tubular member 19 having box end 45 and the components described above. Joint 21 may then operate generally as described above. A person skilled in the art will recognize that such positioning is contemplated and included in the disclosed embodiments.

Accordingly, the disclosed embodiments provide numerous advantages. For example, the disclosed embodiments provide a tubular connector that has an increased compressive load capacity over prior art tubular connectors. In some disclosed embodiments, the compressive strength of the tubular connector is equal to the compressive strength of the pipe joined by the tubular connector. Still further, the disclosed embodiments provide an internal shoulder that is not subject to the tolerance stack up and high stiffness complications of prior art internal shoulders. The disclosed embodiments also provide a tubular connector that has a greater bending capacity than prior art tubular connectors. Still further, the disclosed embodiments do not interfere with the flow profile through the central passage of the joined tubulars. The disclosed embodiments also provide a joint connector for tubular members that does not require a substantial increase in diameter of the joint.

It is understood that the present invention may take many forms and embodiments. Accordingly, several variations may be made in the foregoing without departing from the spirit or scope of the invention. Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

The invention claimed is:

1. A tubular connector having an axis and comprising:
    a pin having a nose, an external shoulder, and a conical portion between the external shoulder and the nose containing a set of external threads;
    a box having a bore, a rim that engages the external shoulder and a set of internal threads in the bore that engage the external threads;
    an internal shoulder in the bore that is engaged by an end of the nose when the rim of the box engages the external shoulder; and
    an annular recess formed in the bore of the box on a side of the internal shoulder opposite the nose to define an inner load bearing flange, the annular recess being sized to provide flexibility to the internal shoulder so as to allow the internal shoulder to deflect when engaged by the end of the nose; wherein
    the inner flange has a minimum flange thickness, and a flange width measured from a base of the inner flange to an inner diameter surface of the inner flange, the flange thickness being greater than 40% of the flange width.

2. The tubular connector of claim 1, wherein the internal shoulder is conical, having an outer diameter spaced farther from an end of the box than an inner diameter.

3. The tubular connector of claim , wherein the annular recess has an inwardly and downwardly facing conical surface and an inwardly and upwardly facing conical surface.

4. The tubular connector of claim 1, wherein the conical surfaces of the annular recess are formed at different angles relative to the axis of the tubular connector.

5. The tubular connector of claim 1, further comprising an annular groove formed at an intersection of an inner diameter of the internal shoulder and the bore.

6. The tubular connector of claim 5, wherein the annular groove has a substantially circular profile in transverse cross-section.

7. The tubular connector of claim 1, wherein the annular recess has a depth at least equal to a radial thickness of the nose.

8. The tubular connector of claim 1, wherein the inner flange is defined by an axial distance between the annular recess and the internal shoulder, the inner flange depending from a side wall of the bore.

9. A tubular connector having an axis and comprising:
    a pin having an upward extending nose, an upward-facing external shoulder, and a conical portion between the external shoulder and the nose containing a set of external threads;
    a box having a bore, a rim that engages the external shoulder and a set of internal threads in the bore that engage the external threads;
    an internal shoulder in the bore that is engaged by an upper end of the nose when the rim of the box engages the external shoulder; and
    an annular recess formed in the bore of the box a selected distance above the internal shoulder to define an inner lead bearing flange the deflects when the internal shoulder is engaged by the upper end of the nose; wherein
    the inner flange has a minimum flange thickness, and the flange width measured from a base of the inner flange to an inner diameter surface of the inner flange, the flange thickness being greater than 40% of the flange width.

10. The tubular connector of claim 9, wherein the annular recess has an inwardly and upwardly facing conical surface that defines an upper surface of the inner flange.

11. The tubular connector of claim 9, wherein:
    the internal shoulder is conical and faces downwardly and outwardly; and
    the inwardly and upwardly facing conical surface of the annular recess is at a same angle relative to the axis of the tubular connector as the internal shoulder.

12. The tubular connector of claim 9, wherein the annular recess comprises:
    a lower conical surface that defines an upper surface of the inner flange; and
    an upper conical surface that is at a lesser angle relative to the axis of the tubular connector than the lower conical surface.

13. The tubular connector of claim 9, wherein:
    the inner flange has an inner diameter equal to an inner diameter of the bore immediately above the annular recess and smaller than an inner diameter of the bore immediately below the inner flange.

14. The tubular connector of claim 9, wherein:
    an inner diameter of the bore immediately above the annular recess is the same as an inner diameter of the bore immediately below the annular recess;
    the annular recess has an axial extent from a junction of an upper side of the annular recess with the bore to a junction with a lower side of the annular recess with the bore; and
    the inner flange has an axial extent from an upper to a lower side of the inner flange at an inner diameter of the inner flange that is less than the axial extent of the annular recess.

15. The tubular connector of claim 9, wherein:
    the inner flange has a base that joins a body of the box and depends downwardly and inwardly from the body of the box; and
    the inner flange has a lesser axial thickness at the base than at a free end.

16. The tubular connector of claim 9, wherein:
    an annular groove is formed at a junction of the internal shoulder with the bore, the annular groove being circular in transverse cross section.

17. The tubular connector of claim 9, wherein the annular recess has a depth at least equal to a radial thickness of the nose of the pin.

18. A tubular connector having an axis and comprising:
    a pin having an upward extending nose, an upward facing external shoulder, and a conical portion between the external shoulder and the nose containing a set of external threads;
    a box having a bore, a rim that engages the external shoulder and a set of internal threads in the bore that engage the external threads;
    the bore having a bore nose portion with an inner diameter that receives the nose of the pin;

an internal shoulder at an upper end of the bore nose portion that is engaged by an upper end of the nose when the rim of the box engages the external shoulder;

the bore of the box having an upper portion extending upward from the internal shoulder that has a lesser inner diameter than an inner diameter of the bore nose portion;

an annular recess formed in the upper portion of the bore of the box a selected distance above the internal shoulder, the annular recess having a conical lower surface and a conical upper surface; and the conical lower surface and the internal shoulder define upper and lower surfaces, respectively, of an inner flange that deflects when the internal shoulder is engaged by the upper end of the nose and the rim is in engagement with the external shoulder; wherein the inner flange has a minimum flange thickness, and a flange width measured from a base of the inner flange to an inner diameter surface of the inner flange, the flange thickness being greater than 40% of the flange width.

19. The tubular connector of claim 18, wherein:
the internal shoulder is conical and tapers inwardly and downwardly.

20. The tubular connector of claim 18, wherein the conical lower surface of the annular recess is at a greater angle relative to the axis than the conical upper surface of the annular recess.

21. The tubular connector of claim 18, wherein an axial dimension of the annular recess measured at an inner diameter of the annular recess is greater than an axial dimension of inner flange measured at an inner diameter of the inner flange.

* * * * *